United States Patent
Van Den Broeke

(12) 
(10) Patent No.: US 6,360,134 B1
(45) Date of Patent: Mar. 19, 2002

(54) METHOD FOR CREATING AND IMPROVED IMAGE ON A PHOTOMASK BY NEGATIVELY AND POSITIVELY OVERSCANNING THE BOUNDARIES OF AN IMAGE PATTERN AT INSIDE CORNER LOCATIONS

(75) Inventor: Doug Van Den Broeke, Sunnyvale, CA (US)

(73) Assignee: Photronics, Inc., Brookfield, CT (US)

( * ) Notice: Subject to any disclaimer, the term of this patent is extended or adjusted under 35 U.S.C. 154(b) by 0 days.

(21) Appl. No.: 09/119,103

(22) Filed: Jul. 20, 1998

(51) Int. Cl.$^7$ .............................................. G06F 19/00
(52) U.S. Cl. ...................................... 700/121; 345/517
(58) Field of Search ................................ 700/121, 171, 700/117, 96, 118, 174, 181; 345/517, 203, 131, 515

(56) References Cited

U.S. PATENT DOCUMENTS

| | | | | |
|---|---|---|---|---|
| 4,648,045 A | * | 3/1987 | Demetrescu | 364/518 |
| 5,393,987 A | * | 2/1995 | Abboud et al. | 250/492.22 |
| 5,428,456 A | * | 6/1995 | Parulski et al. | 358/340 |
| 5,479,273 A | * | 12/1995 | Ramsbottom | 395/9 |
| 5,663,893 A | * | 9/1997 | Wampler et al. | 364/491 |
| 5,703,376 A | * | 12/1997 | Jensen | 250/492.22 |
| 5,847,959 A | * | 12/1998 | Veneklasen et al. | 700/121 |
| 5,876,902 A | * | 3/1999 | Veneklasen et al. | 430/296 |
| 5,973,332 A | * | 10/1999 | Muraki et al. | 250/492.22 |
| 6,011,566 A | * | 1/2000 | Salamon | 345/517 |
| 6,114,071 A | * | 9/2000 | Chen et al. | 430/5 |

\* cited by examiner

*Primary Examiner*—Thomas Lee
*Assistant Examiner*—Rijue Mai
(74) *Attorney, Agent, or Firm*—Amster, Rothstein & Ebenstein

(57) ABSTRACT

An method for creating an image on a photosensitive material with enhanced inside corner resolution using a raster scan exposure system. The photosensitive material may comprise a layer of an unexposed photomask. An energy beam scan is extended by one or more addressable locations beyond the boundaries of the desire pattern at inside corner locations in both X and Y axes. Thus, the image formed in the photosensitive material and, in turn, the attenuator material more accurately reflects the desired image as defined in a data file.

48 Claims, 7 Drawing Sheets

METHOD FOR CREATING AND IMPROVED IMAGE ON A PHOTOMASK BY NEGATIVELY AND POSITIVELY OVERSCANNING THE BOUNDARIES OF AN IMAGE PATTERN AT INSIDE CORNER LOCATIONS

BACKGROUND

The present invention relates to a method and apparatus for creating images in photosensitive material, and more specifically to a method and apparatus for creating photomasks using a raster scan based exposure system in which the image formed in the photosensitive resist material and, in turn, the attenuator material, has improved definition of inside corners.

Photomasks are used in the semiconductor industry to transfer microscale images defining a semiconductor circuit onto a silicon or gallium arsenide substrate or wafer. The process for transferring the image from a photomask to a silicon substrate or wafer is commonly referred to as lithography or microlithography. Generally, a photomask is comprised of a substrate and an attenuator. A typical or binary photomask is comprised of a quartz substrate and a chrome attenuator. The pattern of the attenuator material is representative of the image desired to be formed on a silicon wafer. To develop an image on a silicon wafer, a layer of photosensitive material (i.e., photoresist) is applied to a silicon substrate. The photomask is placed between the silicon wafer and a light or other energy source. The light or energy is inhibited from passing through the areas of the photomask in which the attenuator is present. The solubility of the photoresist material is changed in areas exposed to the light or energy. In the case of a positive photolithographic process, the exposed photoresist becomes soluble and can be removed. In the case of a negative photolithographic process, the exposed photoresist becomes insoluble and unexposed soluble photoresist is removed.

After the soluble photoresist is removed, the latent image is transferred to the substrate by a process well known in the art which is commonly referred to as etching. Once the pattern is etched onto the substrate material, the remaining resist is removed resulting in a finished product.

The pattern formed in the attenuator material defining the image to be transferred to the silicon substrate is produced by a similar process. The desired image to be created on the photomask is initially defined by an electronic data file typically generated by a computer aided design (CAD) system. The data file is loaded into an exposure system which scans an electron beam (E-beam) in a raster fashion across an unexposed or blank photomask which, as shown in FIG. 1A, is comprised of a layer of photosensitive material 2, a layer of attenuator material 4, and a substrate 6.

Examples of raster scan exposure systems are described in U.S. Pat. No. 3,900,737 to Collier and U.S. Pat. No. 3,801,792 to Lin. Each finite location in which the E-beam can be positioned is referred to as an addressable location or pixel. Typically, the physical dimensions of an addressable location, and hence the resolution of the exposure system, are defined by diameter or width of the E-beam. As the E-beam is scanned across the blank photomask, the exposure system energizes the E-beam at addressable locations defined by the electronic data file. As shown in FIG. 1B, the unexposed, soluble photoresist is removed and the exposed, insoluble photoresist material 8 remains adhered to the attenuator material 4. As shown in FIG. 1C, the attenuator material which is no longer covered by the photoresist material is removed by a well known etching process leaving only portions of attenuator material 10 which correspond to the hardened photoresist material 8. As shown in FIG. 1D, the hardened photoresist material is subsequently removed leaving the attenuator material 10 conforming to the image defined in the data file remaining on the substrate. The above process is described utilizing a positive photoresist material, however, the same process is applicable if negative photoresist (i.e., the exposed resist becomes soluable) is utilized.

It will be appreciated that the more accurately the attenuator pattern reflects the desired image defined in the electronic data file, the more accurately the image produced on the silicon substrate will reflect the desired image. However, the pattern formed in the attenuator material by the raster scan exposure system is not a perfect reproduction of the desired image defined by the electronic data file. Factors such as the circular beam diameter, whether or not an edge is scanned or unscanned, and dose proximity effects all effect the quality of the image formed in the photosensitive and attenuator materials. As will be described herein, the degradation in correlation between the desired and created images is most pronounced at "inside corners" locations.

The shortcomings of the prior art process are depicted in FIG. 2. In FIG. 2A, images 12 and 14 represent the desired image to be produced on a photomask as defined by the electronic data file. FIG. 2B depicts the raster scanning process of the E-beam with the vertical arrows depicting the direction of the E-beam scan. When the E-beam 16 is positioned at addressable locations defining the desired images 12 and 14, the E-beam 16 is energized thereby exposing the corresponding portions of photosensitive resist material. In practice, the E-beam is not de-energized when passing between addressable locations which are both intended to be exposed. FIG. 2C depicts the resultant image created in the photoresist material and hence the attenuator material. As shown in FIG. 2C, the inside corners 18 of the image are rounded and do not accurately reflect the image defined by the electronic data file, while outside corners 20 more closely represent the image defined in the data file.

FIG. 3 demonstrates the difference in reproducibility of the desired image at inside corner and outside corner locations. FIG. 3A is an enlarged depiction of a typical outside corner 20. When E-beam 16 reaches the horizontal boundary 22 of the desired image, the beam is de-energized and repositioned for the next scan line. Horizontal boundary 22 is considered an unscanned edge because the E-beam 16 is not passed along the boundary in an uninterrupted scan. Conversely, vertical boundary 24 is considered a scanned edge because E-beam 16 is passed along the boundary in an uninterrupted scan. As the beam is scanned in the scan line directly adjacent to vertical boundary 16, it passes beyond the horizontal boundary 22 thereby forming a clean or sharp corner in the photosensitive resist material.

FIG. 3B is an enlarged depiction of a typical inside corner 18. When E-beam 16 reaches the horizontal boundary 22 of the desired image, the beam is de-energized and, as such, horizontal boundary 22 is considered an unscanned edge. Although vertical boundary 24 is considered a scanned edge (i.e., the beam is passed along the boundary in an uninterrupted scan) the beam does not extend past the horizontal boundary 22. It will therefore be appreciated that an inside corner 18 will be less sharp or more rounded than an outside corner 20. The deviation from the desired image is propagated from the photomask to the silicon substrate thereby degrading the performance or capabilities of the semiconductor circuitry.

Prior art references have considered the limitations of a raster scan exposure system for use in creating photomasks. For example, U.S. Pat. No. 4,498,010 issued to Biecheler addresses the problem of producing images in photosensitive material in which the edge of an the image is between two rows of addressable locations. To overcome system resolution incompatibility, every other addressable locations of the scan line that is beyond the desired image is exposed to the particle beam. After exposure, the areas or valleys between the alternately exposed addressable locations are allegedly filled and the feature width is approximately one-half a addressable location width.

In the related field of optical proximity correction technology, U.S. Pat. No. 5,663,893 to Wampler describes the use of serifs to more accurately produce a desired image on the silicon substrate. Serifs are selective distortions of the features of the attenuator pattern which improve the quality of resulting images through the use of well known micro-optic principles (e.g., diffraction). The use of serifs are generally described with reference to FIG. 4. As shown in FIG. 4A, the desired image 26 to be created on a silicon substrate is a square. With reference to FIG. 4B, the desired image to be formed in the photosensitive resist material includes serifs 28 at each corner, each serif including inside corners 30a–30c. FIG. 4C represents the image created in the photoresist material and attenuator material using the raster scan E-beam process described above. As shown, inside corners 34a–34c of the serifs 32 are rounded thereby reducing their micro-optic effects and thus the quality of the image formed on the silicon substrate. As will be discussed further herein, the present invention can be used in conjunction with serifs to improve the quality of the created image.

SUMMARY OF INVENTION

Accordingly, it is the object of the present invention to provide a method for creating an image in a photosensitive material which more accurately reflects the desired image as defined by an electronic data file.

It is a further object of the present invention to provide a method for creating photomasks using raster scan exposure systems wherein the images formed on photomasks produced by the method more accurately reflect the desired image as defined in an electronic data file.

It is a further object of the present invention to provide a method for creating semiconductor wafers using raster scan exposure systems wherein the images formed on the wafers produced by the method more accurately reflect the desired image as defined in an electronic data file.

It is still a further object of the present invention to provide a raster scan exposure system which produces images in photosensitive materials which more accurately reflects the desired image to be produced as defined by an electronic data file.

DETAILED DESCRIPTION OF THE PREFERRED EMBODIMENT

To correct the shortcomings of the prior art with respect to the imaging of inside corners as described above, the present invention extends the E-beam scan by a one or more addressable locations or pixel at each, or selected, inside corners. In accordance with the preferred embodiment of the present invention the, E-beam is overscanned in the direction of the beam scan as well as the direction perpendicular to the beam scan. In other words, addressable locations adjacent to an inside corner location in both the X and Y axes are both exposed to the energized E-beam.

Figure 5A:
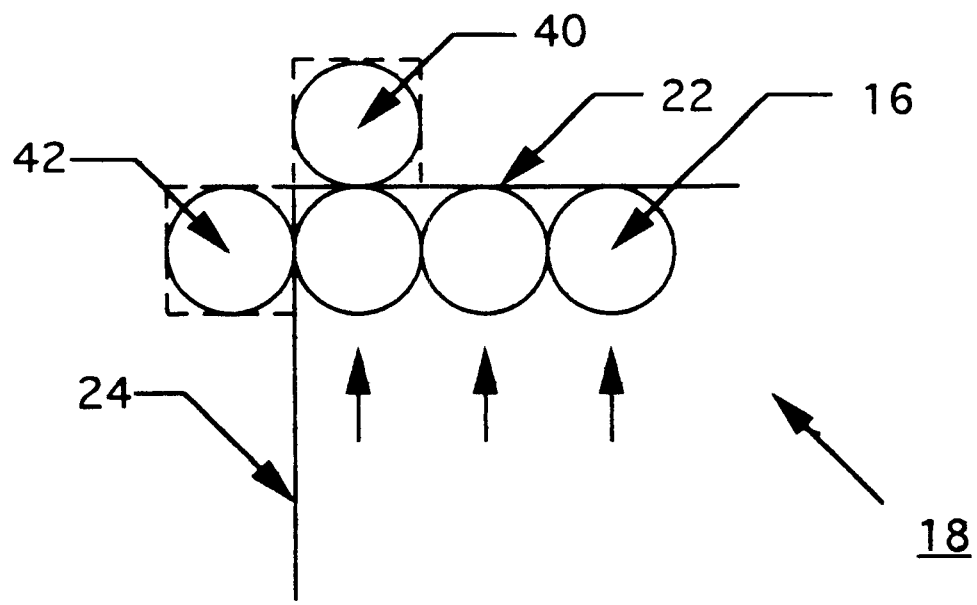
FIG. 5 illustrates how inside corners of an image are formed in a photosensitive material by the method of the present invention.

With reference to FIG. 5A, the E-beam 16 is scanned in the direction perpendicular to horizontal edge 22, and as shown, the E-beam scan is generally terminated at addressable locations defined by the horizontal edge or boundary 22. However, in accordance with the present invention, when the E-beam is scanned in the scan line adjacent to vertical edge or boundary 24, the scan is extended into addressable location 40 which is beyond the horizontal boundary 22. Additionally, in accordance with the present invention, the beam is scanned in a scan line adjacent to, but outside vertical boundary 24. However, the beam is only energized in the addressable location 42 which is also adjacent to horizontal boundary 22. Thus, it will be appreciated that in the above described preferred embodiment, the scan extension is in both horizontal (X axis) and vertical (Y axis) directions.

Figure 5B:
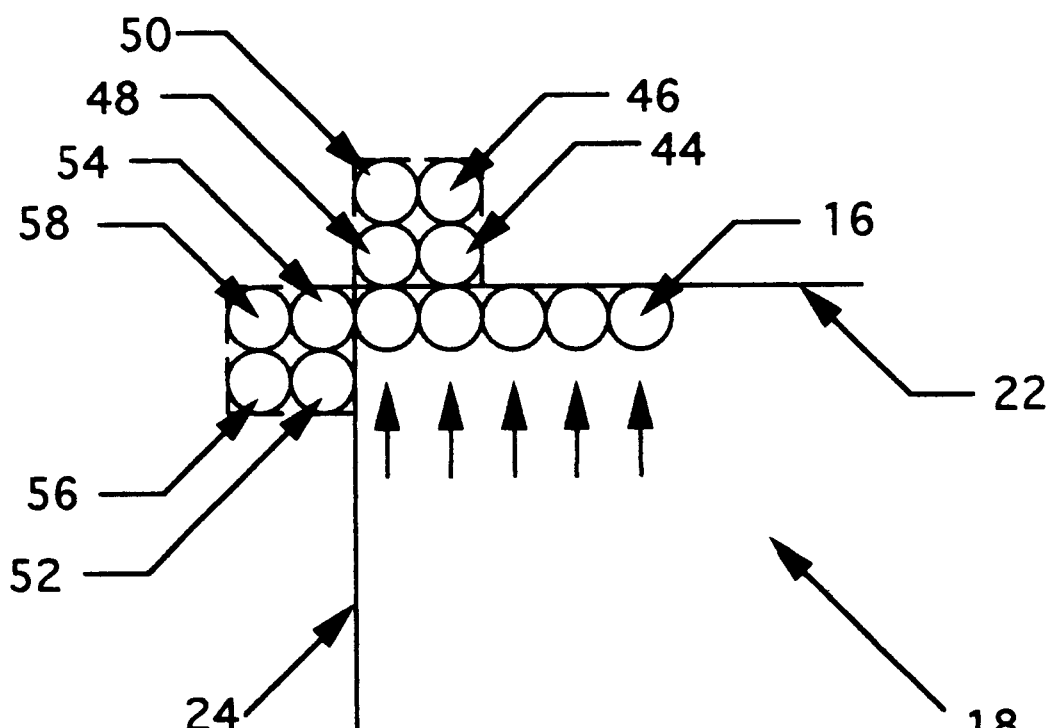
Figure 6A:
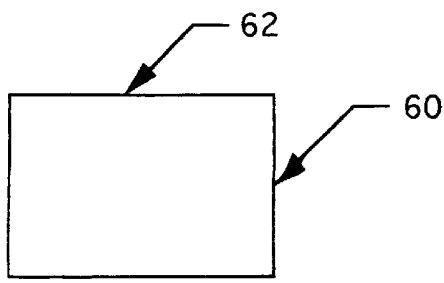
FIG. 6 describes the process used in the present invention to modify the data file of the desired image.
Figure 6B:
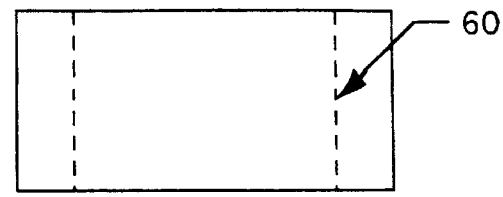
Figure 6C:
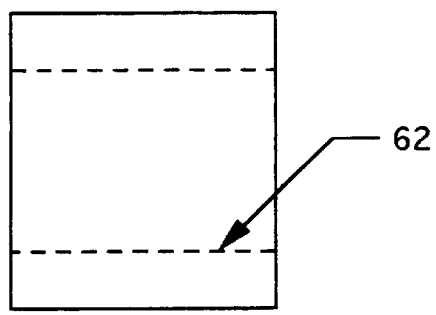
Figure 6D:
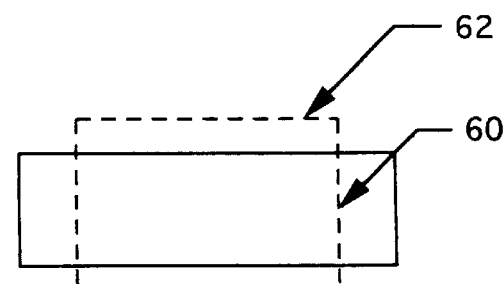
Figure 6E:
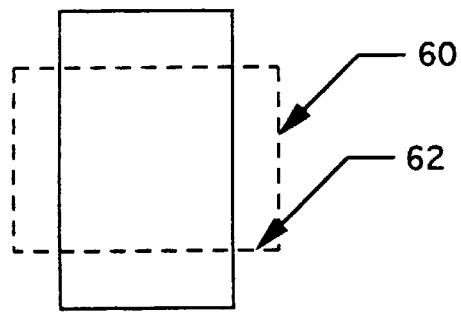
Figure 6F:
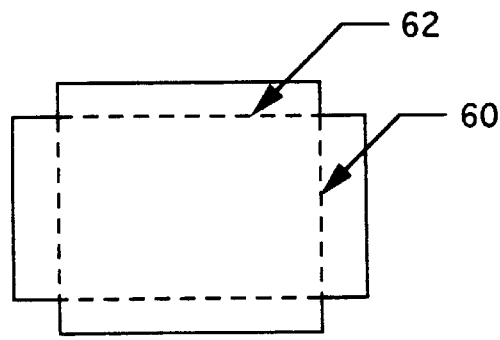
Figure 6G:
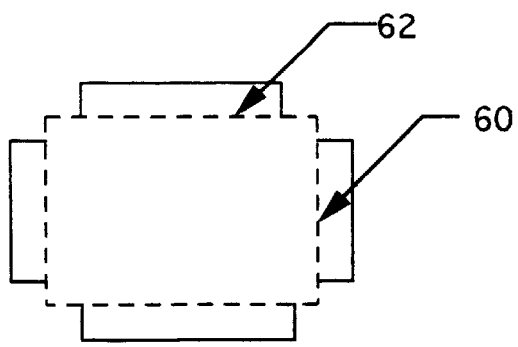
Figure 6H:
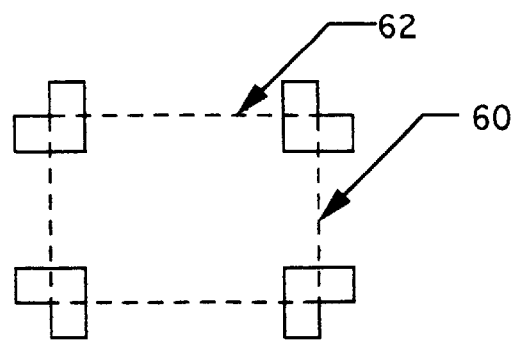
Figure 6I:
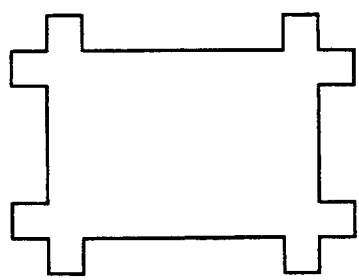

Depending on the size of the E-beam diameter, the scan of the beam may be extended more than one addressable location in both the horizontal and vertical directions. FIG. 5B shows an embodiment of the present invention in which the E-beam is overscanned by two addressable locations in both the horizontal and vertical directions because of the reduced beam diameter. With reference to FIG. 5B, E-beam 16 is scanned in the direction perpendicular to horizontal edge 22 with the scan being terminated at addressable locations defined by horizontal edge 22. However, in accordance with the present invention, when the E-beam is scanned in the two scan lines closest to vertical boundary 24, the scan is extended into addressable locations 44, 46, 48, and 50 respectively which are beyond the horizontal boundary 22. Additionally, the beam is scanned in the two scan lines closest to, but outside vertical boundary 24. However, the beam is only energized in the addressable locations 52, 54, 56, and 58 which are adjacent to horizontal boundary 22.

Figure 4A:
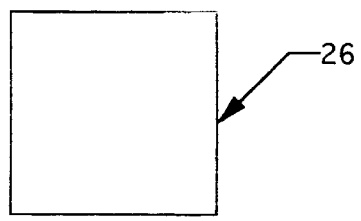
FIGS. 4A–4C illustrate one type of optical proximity correction technology known as serifs.
Figure 4B:
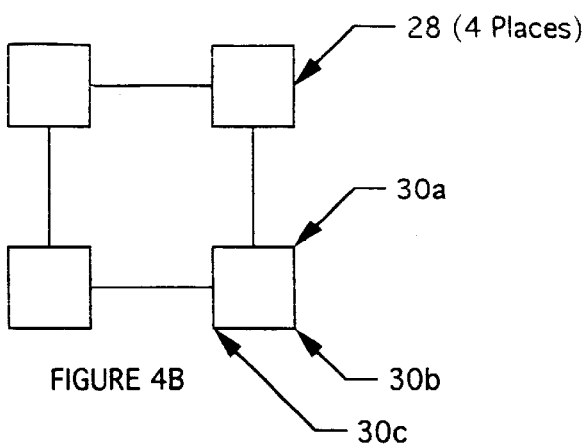
Figure 4C:
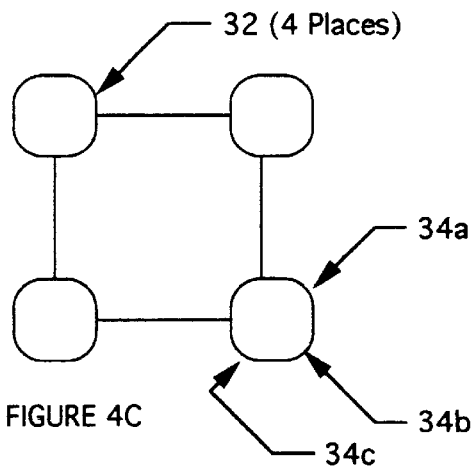
Figure 4D:
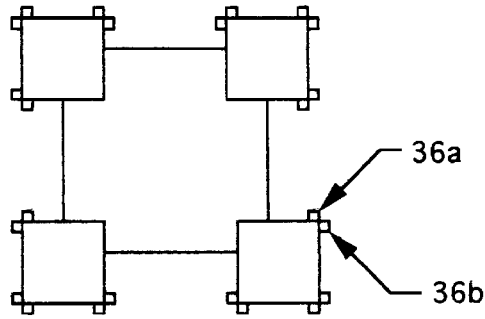
FIGS. 4D–4E illustrate the addition of the present invention to serifs and the resulting improved serif inside corner definition.
Figure 4E:
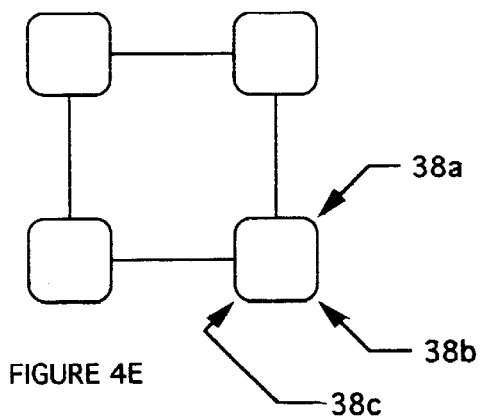

As indicated above, the present invention can be utilized in conjunction with the optical proximity correction known as serifs. FIG. 4C illustrates the pattern formed in the photosensitive resist wherein the desired image includes serifs 32 at each corner. As shown, the inside corners of the serifs 34a–34c are rounded and not as sharp as corners 30a–30c defined in the electronic data file illustrated by FIG. 4C. FIG. 4D depicts the data file of FIG. 4C modified to include overscan at each inside corner location in both the horizontal and vertical directions depicted by references 36b and 36a. FIG. 4E illustrates the pattern formed in the photosensitive resist based on the modified pattern data. As shown, the inside corners 38a–38c of the image formed in the photoresist material using the overscan technique of the present invention more accurately reflect the desired image defined by the electronic data file shown in FIG. 4B.

Although the above embodiments of the present invention discuss the amount of overscan to be the same in both the horizontal and vertical directions, such need not be the case. The amount of overscan in each direction can be asymmetric and take into account factors such as beam shape. Additionally, although the above descriptions of the E-beam positioning discuss the scanning of the beam in a vertical direction, it will be appreciated that the present invention can be practiced independent of the direction of scan so long as the photoresist material is exposed at the appropriate addressable locations.

FIG. 6 describes the process for modifying the original electronic data file using standard boolean operations. In each of the figures the original pattern is shown by vertical boundary 60 and horizontal boundary 62 FIG. 6A illustrates the original data file defining the image desired to be formed in the photosensitive resist material. In accordance with the present invention, the original pattern is sized positively in the X-axis only by the desired amount of overscan to generate the intermediate pattern shown in FIG. 6B. The intermediate pattern of FIG. 6B is next sized positively in the Y-axis only by the desired amount of overscan to generate the intermediate pattern shown in FIG. 6C. The intermediate pattern of FIG. 6C is next sized negatively in the Y-axis only by the desired amount of overscan to generate the intermediate pattern shown in FIG. 6D. The original pattern data is next sized negatively in the X-axis only by the desired amount of overscan to generate the intermediate pattern shown in FIG. 6E. The intermediate patterns shown in FIGS. 6B and 6C are then "OR'ed" to generate the intermediate pattern shown in FIG. 6F. Next, the intermediate patterns shown in FIGS. 6D and 6E are then "OR'ed" to generate the intermediate pattern shown in FIG. 6G. The intermediate patterns shown in FIGS. 6F and 6G are then "OR'ed" to generate the 15 intermediate pattern shown in FIG. 6H. Finally, the original pattern shown in FIG. 6A is "OR'ed" with the intermediate pattern shown in FIG. 6H to generate the final pattern shown in FIG. 6I which contains the desired amount of scan extensions located at the inside corners.

Figure 1A:
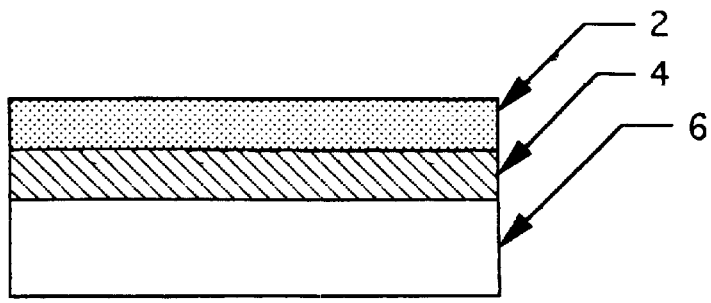
FIGS. 1A–1D illustrate the process for creating an image on a photomask.
Figure 1B:
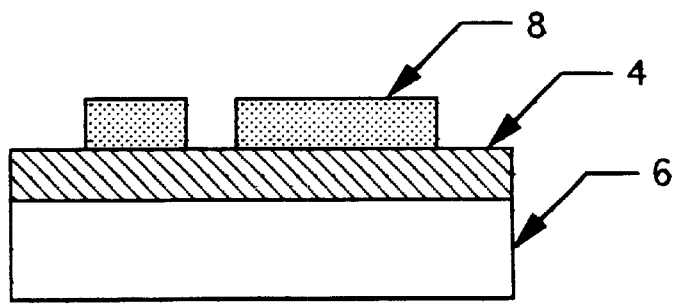
Figure 1C:
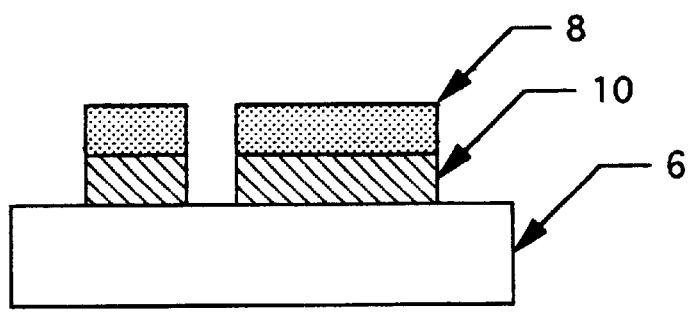
Figure 1D:
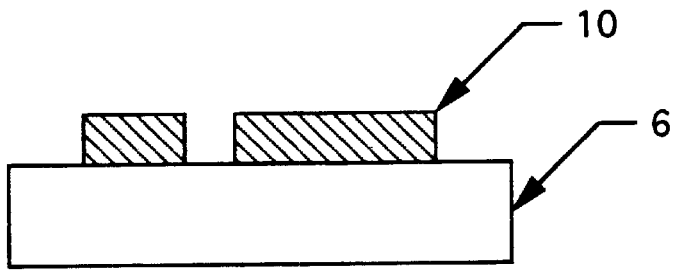
Figure 2A:
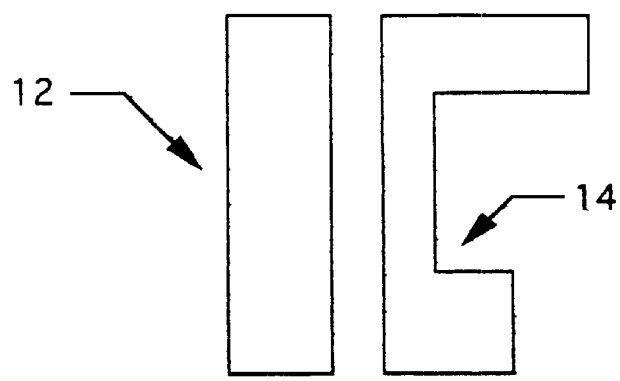
FIGS. 2A–2C illustrate the prior art process for creating images in photosensitive material using a raster scan exposure systems.
Figure 2B:
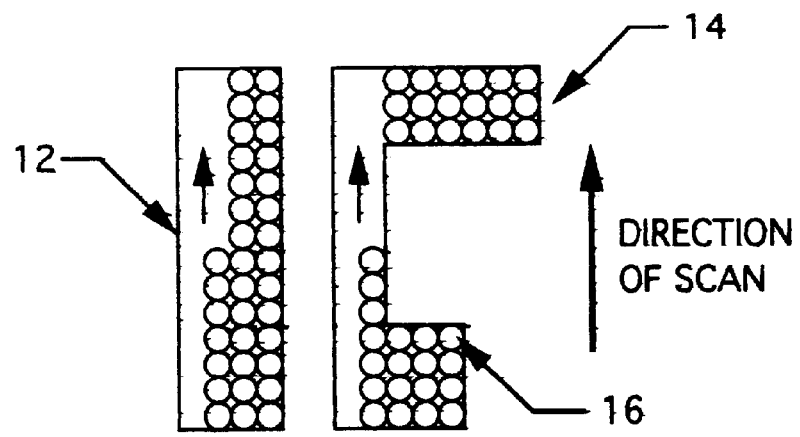
Figure 2C:
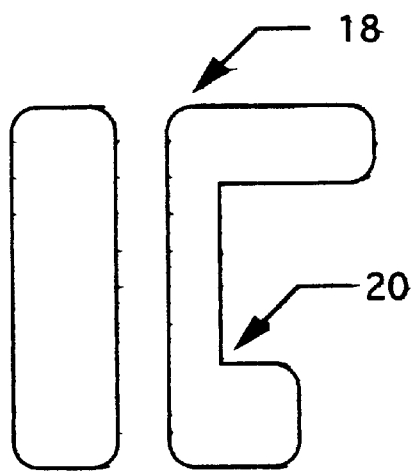
Figure 3A:
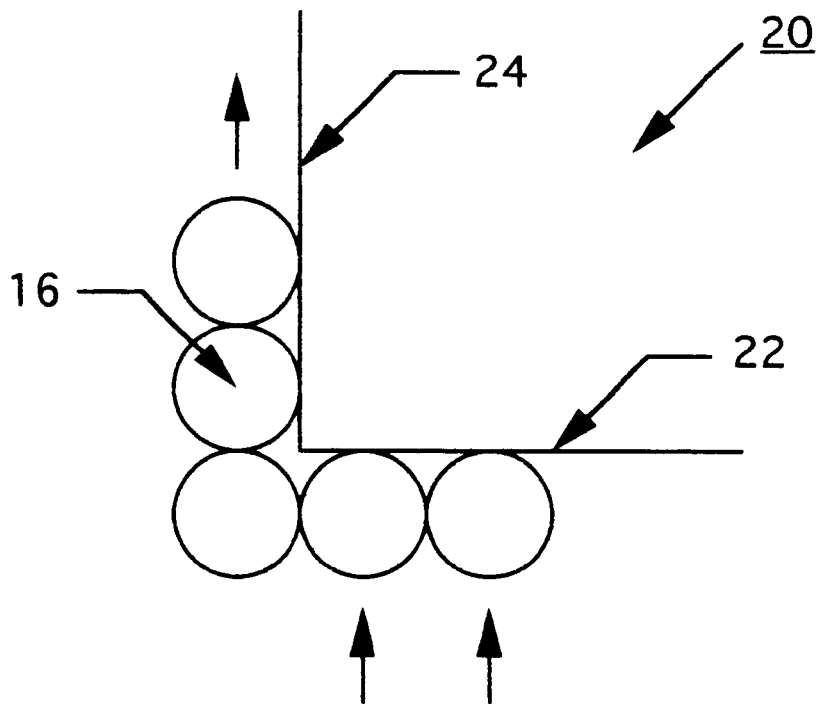
FIGS. 3A–3B illustrate how inside and outside corners of an image is formed in a photosensitive material by the prior art raster scan exposure systems.
Figure 3B:
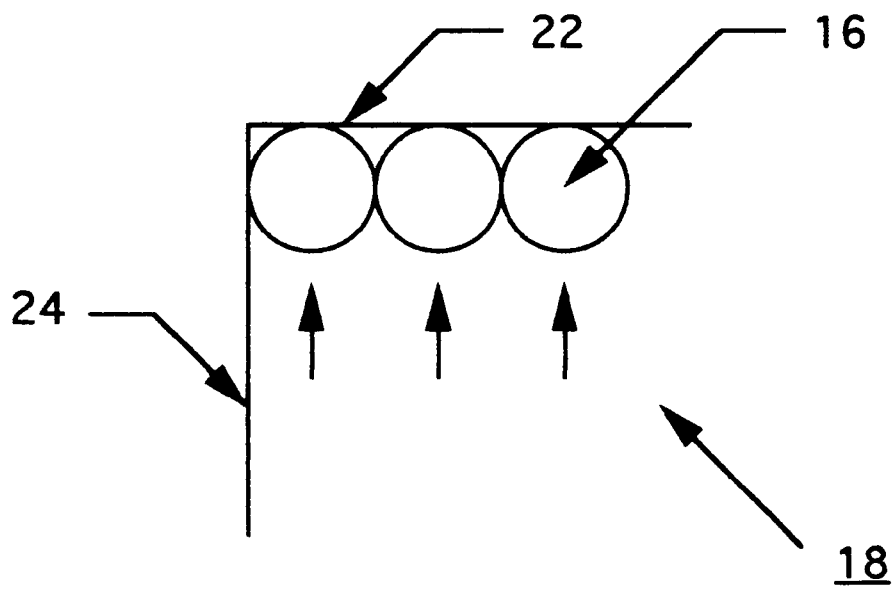

Although FIGS. 6A–6I describe a method for modifying a data file comprising s rectangular shape, those skilled in the art will appreciate that the above described method is also applicable to more complex images such as image 14 of FIG. 2A. Additionally, those skilled in the art will appreciate that by comparing the modified file shown in FIG. 6I to the original file shown in FIG. 6A, the location of inside corners can be assertained.

The scan extension technique for inside corners of the present invention can be realized in a number of ways. The first way in which the scan extension can be realized is by including the desired amount of scan extension in both horizontal and/or vertical directions in the original data file defining the desired image to be formed in the photosensitive resist material. The data file can be loaded into the lithographic exposure system without further processing.

The second way in which the scan extension can be realized is by modifying an electronic data file adding desired amount of scan extension in both horizontal and/or vertical directions before the data is loaded into the lithographic exposure system. Such a modification could be carried out by the computer aided design system in which the original data file was created by performing the steps illustrated in FIG. 6. Alternatively, the modification could be performed by a separate computer based system which is capable of accepting and reading the original data file in the format and on the media created by the computer aided design system. After reading and modifying the original data file, the computer based system would write the modified data file to a media, which may include the media on which the original data file was stored, which is compatible with the lithographic exposure system. One advantage of this implementation is that the lithographic exposure system does not need to be modified. However, one drawback is that the scan extension modification process needs to be performed on each data file which would add a constant recurring cost to the production of each photomask.

A third way in which the scan extension method of the present invention can be realized is by modifying the lithographic exposure system such that the scan extension technique of the present invention is performed automatically during the exposure process using the original data file. While such a modification would result in a one time non-recurring cost, there would be no recurring costs for the production of each individual photomask.

Various additional modifications and improvements thereon will become readily apparent in those skilled in the art. For example, the present invention can be utilized in exposure systems utilizing energy beams other than E-beams such as lasers, ion beams, or x-rays. Furthermore, a semiconductor wafer can be directly created by exposing the photosensistive material on the unexposed wafer to a raster scanned E-beam in accordance with the method of the present invention.

Accordingly, the spirit and scope of the present invention is to be construed broadly and limited only by the appended claims, and not by the foregoing specification.

What is claimed is:

1. A method for creating an image in a photosensitive material utilizing a raster scan exposure system comprising the steps of:
   (a) creating an initial data file comprising information defining the desired image to be produced in said photosensitive material,
   (b) determining the amount of overscan for inside corner locations of said initial data file,
   (c) creating a first set of intermediate data patterns by positively sizing said data file in horizontal and vertical directions by said determined amount of overscan,
   (d) creating a second set of intermediate data patterns by negatively sizing said first set of intermediate data patterns in horizontal and vertical directions by said determined amount of overscan,
   (e) performing boolean operations on said first and second set of intermediate data patterns and said initial data file to generate a modified data file having said determined amount of overscan at inside corner locations, and
   (f) scanning a beam of radiation generated by said exposure system across the photosensitive material in accordance with said modified data file.

2. The method for generating an image in a photosensitive material according to claim 1 wherein said data file for use by said exposure system is generated by a computer aided design system.

3. The method for generating an image in a photosensitive material according to claim 1 wherein determination of the amount of overscan for each of said inside corner locations is a function of said exposure system's radiation beam dimensions.

4. The method for generating an image in a photosensitive material according to claim 1 wherein the amount of desired overscan is different for the horizontal and vertical directions.

5. The method for generating an image in a photosensitive material according to claim 1 wherein said radiation beam of said exposure system is an E-Beam.

6. The method for generating an image in a photosensitive material according to claim 1 wherein said radiation beam of said scan exposure system is X-ray.

7. The method for generating an image in a photosensitive material according to claim 1 wherein said radiation beam of said exposure system is a Laser.

8. The method for generating an image in a photosensitive material according to claim 1 wherein said radiation beam of said exposure system is an ion beam.

9. The method for generating an image in a photosensitive material according to claim 1 wherein said photosensitive material comprises a layer of an unexposed photomask.

10. The method for generating an image in a photosensitive material according to claim 1 wherein said photosensitive material comprises a layer of an unexposed semiconductor wafer.

11. A method for making a photomask comprising the steps of:
 (a) creating an initial data file comprising information defining the desired image to be produced on an unexposed photomask,
 (b) determining the amount of overscan for inside corner locations of said initial data file,
 (c) creating a first set of intermediate data patterns by positively sizing said data file in horizontal and vertical directions by said determined amount of overscan,
 (d) creating a second set of intermediate data patterns by negatively sizing said first set of intermediate data patterns in horizontal and vertical directions by said determined amount of overscan,
 (e) performing boolean operations on said first and second set of intermediate data patterns and said initial data file to generate a modified data file having said determined amount of overscan at inside corner locations, and
 (f) loading said modified data file into a raster scan exposure system, said exposure system utilizing said modified data file to expose portions of said unexposed photomask to a beam of radiation, said exposed portions of said unexposed photomask conforming to the desired pattern of attenuator material on said photomask.

12. The method for generating a photomask according to claim 11 wherein said data file for use by said exposure system is generated by a computer aided design system.

13. The method for generating a photomask according to claim 11 wherein said determination of an amount of desired overscan for each of said inside corner locations is a function of the dimensions of said radiation beam.

14. The method for generating a photomask according to claim 11 wherein the amount of desired overscan is different in the horizontal and vertical directions.

15. The method for generating a photomask according to claim 11 wherein said radiation beam is an E-beam.

16. The method for generating a photomask according to claim 11 wherein said radiation beam is an X-ray.

17. The method for generating a photomask according to claim 11 wherein said radiation beam is a Laser.

18. The method for generating a photomask according to claim 11 wherein said radiation beam is an ion beam.

19. The method for generating a photomask according to claim 11 wherein said photomask is comprised of glass substrate and a chrome attenuator.

20. The method for generating a photomask according to claim 11 wherein said photomask is comprised of a glass substrate and a MoSiON attenuator.

21. A method for producing a semiconductor wafer comprising the steps of:
 (a) creating an initial data file comprising information defining the desired image to be produced on an unexposed semiconductor wafer,
 (b) determining the amount of overscan for inside corner locations of said initial data file,
 (c) creating a first set of intermediate data patterns by positively sizing said data file in horizontal and vertical directions by said determined amount of overscan,
 (d) creating a second set of intermediate data patterns by negatively sizing said first set of intermediate data patterns in horizontal and vertical directions by said determined amount of overscan,
 (e) performing boolean operations on said first and second set of intermediate data patterns and said initial data file to generate a modified data file having said determined amount of overscan at inside corner locations, and
 (f) loading said modified data file into a raster scan exposure system, said exposure system utilizing said modified data file to expose portions of said unexposed semiconductor wafer to a beam of radiation, said exposed portions of said semiconductor wafer conforming to the desired pattern to be produced on said semiconductor wafer.

22. The method for generating a semiconductor wafer according to claim 21 wherein said data file for use by said exposure system is generated by a computer aided design system.

23. The method for generating a semiconductor wafer according to claim 21 wherein determination of an amount of overscan for each of said inside corner locations is a function of the dimensions of said radiation beam.

24. The method for generating a semiconductor wafer according to claim 21 wherein an amount of desired overscan in both the horizontal and vertical directions is determined for each of said inside corner locations.

25. The method for generating a semiconductor wafer according to claim 21 wherein said radiation beam is an E-beam.

26. The method for generating a semiconductor wafer according to claim 21 wherein said radiation beam is an X-ray.

27. The method for generating a semiconductor wafer according to claim 21 wherein said radiation beam is an ion beam.

28. The method for generating a semiconductor wafer according to claim 21 wherein said radiation beam is a Laser.

29. A method for producing an image in a photosensitive material utilizing a raster scan exposure system comprising the steps of:
 (a) creating a data file comprising information defining the desired image to be produced on said photosensitive material,
 (b) loading said data file into said exposure system, said exposure system:
  (1) creating an initial data file comprising information defining the desired image to be produced in said photosensitive material, (2) determining the amount of overscan for inside corner locations of said initial data file, (3) creating a first set of intermediate data patterns by positively sizing said data file in horizontal and vertical directions by said determined amount of overscan, (4) creating a second set of intermediate data patterns by negatively sizing said first set of intermediate data patterns in horizontal and vertical directions by said determined amount of overscan, (5) performing boolean operations on said first and second set of intermediate data patterns and said initial data file to generate a modified data file having said determined amount of overscan at inside corner locations, and (6) scanning a beam of radiation generated by said exposure system across said photosensitive material in accordance with said modified data file.

30. The method for generating an image in a photosensitive material according to claim 29 wherein said data file for use by said exposure system is generated by a computer aided design system.

31. The method for generating an image in a photosensitive material according to claim 29 wherein said photosensitive material comprises a layer of an unexposed photomask.

32. The method for generating an image in a photosensitive material according to claim 29 wherein said photosensitive material comprises a layer of an unexposed semiconductor wafer.

33. The method for generating an image in a photosensitive material according to claim 29 wherein determination of the amount of overscan for each of said inside corner locations is a function of the dimensions of said radiation beam.

34. The method for generating an image in a photosensitive material according to claim 29 wherein an amount of desired overscan in both the horizontal and vertical directions is determined for each of said inside corner locations.

35. The method for generating an image in a photosensitive material according to claim 29 wherein said radiation beam is an E-Beam.

36. The method for generating an image in a photosensitive material according to claim 29 wherein said radiation beam is an X-ray.

37. The method for generating an image in a photosensitive material according to claim 29 wherein said radiation beam is an ion beam.

38. The method for generating an image in a photosensitive material according to claim 29 wherein said radiation beam is a Laser.

39. A method for creating an image in a photosensitive material comprising the steps of:

(a) creating a data file for use by a raster scan exposure system, said data file comprising information defining the desired image to be produced in said photosensitive material, (b) determining the location of inside corners of said desired image based on said data file, (c) determining the amount of overscan for each of said inside corner locations, and (d) scanning a beam of radiation produced by said exposure system across the photosensitive material in accordance with said information in said data file, wherein said determined amount of overscan is overscanned beyond boundaries of said inside corner locations.

40. The method for generating an image in a photosensitive material according to claim 39 wherein said data file for use by said exposure system is generated by a computer aided design system.

41. The method for generating an image in a photosensitive material according to claim 39 wherein determination of the amount of overscan for each of said inside corner locations is a function of said exposure system's radiation beam dimensions.

42. The method for generating an image in a photosensitive material according to claim 39 wherein the amount of desired overscan is different for the horizontal and vertical directions.

43. The method for generating an image in a photosensitive material according to claim 39 wherein said radiation beam of said exposure system is an E-Beam.

44. The method for generating an image in a photosensitive material according to claim 39 wherein said radiation beam of said scan exposure system is X-ray.

45. The method for generating an image in a photosensitive material according to claim 39 wherein said radiation beam of said exposure system is a Laser.

46. The method for generating an image in a photosensitive material according to claim 39 wherein said radiation beam of said exposure system is an ion beam.

47. The method for generating an image in a photosensitive material according to claim 39 wherein said photosensitive material comprises a layer of an unexposed photomask.

48. The method for generating an image in a photosensitive material according to claim 39 wherein said photosensitive material comprises a layer of an unexposed semiconductor wafer.

* * * * *